United States Patent [19]  [11]  4,400,622
Takeuchi et al.  [45]  Aug. 23, 1983

[54] ELECTRON LENS EQUIPMENT

[75] Inventors: Yoshinobu Takeuchi; Katsuhiro Kuroda, both of Hachioji; Susumu Ozasa, Kashiwa, all of Japan

[73] Assignees: Nippon Telegraph & Telephone Public Corporation; Hitachi, Ltd., both of Tokyo, Japan

[21] Appl. No.: 225,269

[22] Filed: Jan. 15, 1981

[30] Foreign Application Priority Data
Jan. 30, 1980 [JP] Japan .................................. 55-8797

[51] Int. Cl.³ ............................................. H01J 3/20
[52] U.S. Cl. ........................................... 250/396 ML
[58] Field of Search ..................... 250/396 ML, 396 R

[56] References Cited
U.S. PATENT DOCUMENTS 2,323,328 7/1943 Hillier .............................. 250/396 R
3,560,739 2/1971 Wolff ............................. 250/396 ML
3,812,365 5/1974 LePoole ........................ 250/396 ML

FOREIGN PATENT DOCUMENTS 55-1186 1/1980 Japan ........................... 250/396 ML
55-1187 1/1980 Japan ........................... 250/396 ML Primary Examiner—Alfred E. Smith
Assistant Examiner—Carolyn E. Fields
Attorney, Agent, or Firm—Antonelli, Terry & Wands

[57] ABSTRACT

An electron lens system wherein at least two coils are arranged in the vicinity of an electron-optical lens and are excited in directions opposite to each other, thereby making it possible to adjust the focal distance of the lens without including a rotation attributed to the electron-optical lens in an electron beam which passes through the lens.

8 Claims, 3 Drawing Figures

ELECTRON LENS EQUIPMENT

BACKGROUND OF THE INVENTION

This invention relates to an electron lens equipment for use in an apparatus for electron beam lithography, and the like.

In general, in an apparatus for electron beam lithography for use in semiconductor production, for example, defocusing occurs when an electron beam is widely deflected. Therefore, it has hitherto been the practice to provide a so-called dynamic focusing correction according to which only one coil or subcoil is arranged within the magnetic field of a lens and is used to change the focal distance thereof. At this time, however, a rotation of the electron beam by the lens develops, and when the electron beam is deflected from the center axis of the lens, a displacement thereof develops. In a conventional system in which the electron beam is caused to pass on only the center axis of the lens, the rotation poses no problem.

In recent years, an electron-optical system in which the electron beam is caused to pass outside the axis of the electron lens has been proposed. However, in such a system, the displacement due to rotation of the electron beam becomes an important problem. Especially in the case where the positioning needs to be made at high precision, as in apparatus for electron beam lithography, it becomes a serious problem.

Figure 1 is a diagram for explaining a prior art electron lens system. Letting $B_L$ denote a magnetic field established by a lens 2 and $B_C$ denote a magnetic field established by a coil 3, the focal distance f and the rotation $\theta$ at this time are as follows:

$$\frac{1}{f} = \frac{e}{8 m \Phi_o} \int (B_L + B_C)^2 dz \quad (1)$$

$$\theta = \sqrt{\frac{e}{8 m \Phi_o}} \int (B_L + B_C) dz \quad (2)$$

where e denotes the electron charge, m the mass of electron, and $\Phi_o$ the accelerating voltage.

Now, considering the variations $\Delta$ of the respective quantities from the time when $B_C=0$, $$\Delta\left(\frac{1}{f}\right) = \frac{e}{8 m \Phi_o} \int 2 B_L B_C dz \quad (3)$$

$$\Delta\theta = \sqrt{\frac{e}{8 m \Phi_o}} \int B_C dz \quad (4)$$

provided that $B_L >> B_C$. Here, the half-width of the magnetic field of the lens 2 is denoted by $L_L$, and the distance between the lens 2 and a focusing plane 1 is denoted by b. When the respective integrals in the above expressions (1)–(4) are expressed by the maximum values and half-widths of the magnetic fields, and the resultant expressions are arranged on the supposition that only the focusing plane is moved by the change of the focal distance, the following approximate expression holds:

$$\Delta\theta = -\frac{\Delta b}{b^2} \cdot \frac{\sqrt{f_L \cdot L_L}}{2}$$

where $\Delta b$ denotes the variation of b, and $f_L$ denotes the focal distance at $B_C=0$. In the figure, $B_{Lmax}$ and $B_{Cmax}$ indicate the maximum values of the magnetic fields of the lens 2 and the coil 3, respectively, $L_C$ the half-width of the magnetic field of the coil 3, and a the distance between an objective point 4 and the lens 2.

Now, assuming by way of example that b=80 mm, $\Delta b$=0.1 mm, $f_L$=50 mm and $L_L$=50 mm, then $\Delta\theta$=0.4 mrad=milliradians holds. Supposing that the electron beam has been deflected in a stage preceding the lens, and letting r denote the deflection on the focusing plane, the displacement $\delta$ is expressed by $\delta$=r·$\Delta\theta$. To cite examples in a typical practical range, when r=1.4 mm (2 mm□ field), a displacement (in a direction perpendicular to the Z-axis illustrated of $\delta$=0.56 μm develops, and when r=2.1 mm (3 mm□ field), a displacement of $\delta$=0.84 μm develops. These displacements pose a serious problem when it is intended to attain a high precision with 0.1 μm as in the apparatus for electron beam lithography.

SUMMARY OF THE INVENTION

This invention has been made in view of the drawback described above, and has for its object to provide an electron lens equipment which can vary only the focal distance without incurring the displacement as stated above.

In order to accomplish this object, according to this invention, an electron lens system comprises an electron-optical lens, at least two coils or subcoils which are juxtaposed along an optical axis in the vicinity of the electron-optical lens, the coils or subcoils being excited in directions opposite to each other, thereby making it possible to adjust the focal distance of said electron-optical lens in such a manner that an electron beam passing through said electron-optical lens does not undergo any rotation ascribable to said electron-optical lens.

DETAILED DESCRIPTION OF THE PREFERRED EMBODIMENTS

Hereunder, this invention will be described in detail with reference to various embodiments.

Figure 1:
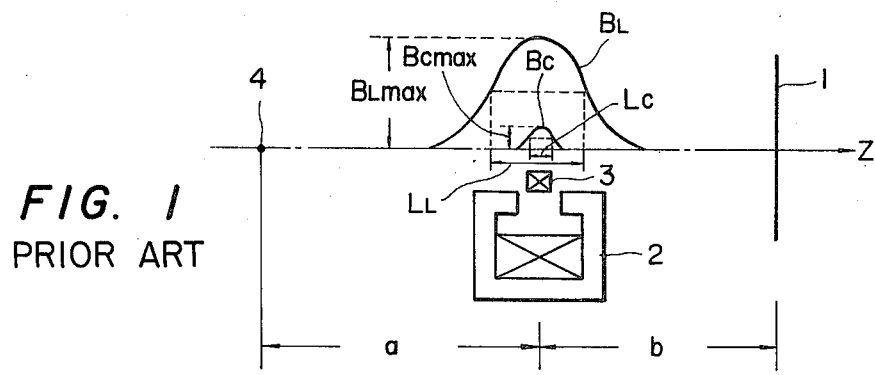
FIG. 1 is a diagram for explaining a prior art electron lens system.
Figure 2:
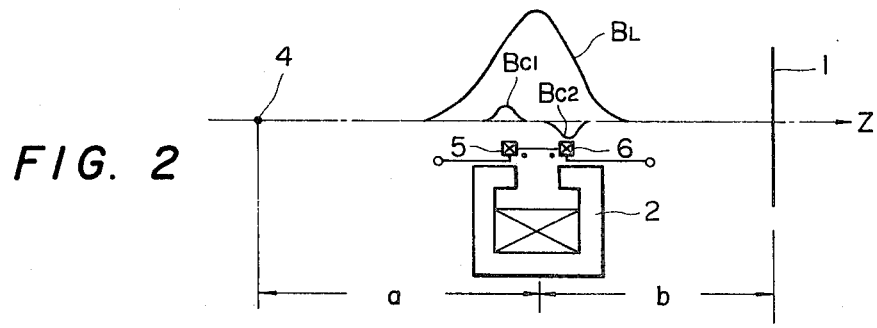
FIGS. 2 and 3 are diagrams each showing a respective embodiment of this invention.
Figure 3:
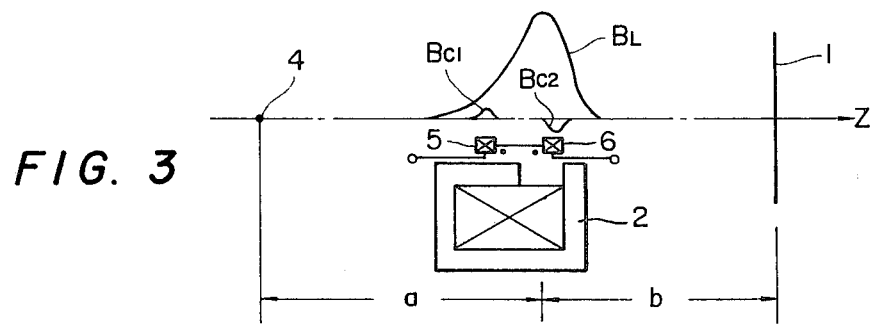

Figures 2 and 3 are diagrams each elucidating an embodiment of an electron lens equipment according to this invention. As shown in each figure, this invention provides a system which is so constructed that at least two coils or subcoils 5 and 6 are arranged in the vicinity of an electron-optical lens 2 and that the coils or subcoils 5 and 6 are excited in directions opposite to each other so as to adjust the focus of the electron-optical lens 2. More specifically, the two coils or subcoils 5 and 6 are arranged in the vicinity of the lens 2, at least one of the coils or subcoils is arranged within the magnetic field of the lens, and the coils or subcoils are excited in directions opposite to each other. In each figure, numeral 1 designates a focusing plane, and numeral 4 an objective point.

It will be evident from the following description that the problem in the prior art as previously stated is avoided with the construction shown in either FIG. 2 or FIG. 3. In each figure, magnetic fields established by the coils or subcoils 5 and 6 respectively are denoted by $B_{C1}$ and $-B_{C2}$. Here, the following holds:

$$\int B_{C1}\,dz = \int B_{C2}\,dz$$

Accordingly, in both the cases of FIGS. 2 and 3, $$\Delta\theta = \sqrt{\frac{e}{8m\Phi_o}}\int (B_{C1} - B_{C2})\,dz = 0$$

holds, and no rotation occurs.

In both the cases of FIGS. 2 and 3, $$\Delta\left(\frac{1}{f}\right) = \frac{e}{8m\Phi_o}\int \{2B_L(B_{C1} - B_{C2}) + (B_{C1} - B_{C2})^2\}\,dz$$

holds.

Now, when the magnitudes of the magnetic field $B_L$ of the lens on the locations of $B_{C1}$ and $B_{C2}$ are substantially equal as illustrated in FIG. 2, $$\int B_L \cdot B_{C1}\,dz = \int B_L \cdot B_{C2}\,dz$$

holds. Therefore, $$\Delta\left(\frac{1}{f}\right) = \frac{e}{8m\Phi_o}\int (B_{C1} - B_{C2})^2\,dz$$

holds. Unless the magnetic fields $B_{C1}$ and $B_{C2}$ overlap, this can be approximated as follows:

$$\Delta\left(\frac{1}{f}\right) \approx \frac{e}{8m\Phi_o}(B_{C1}^2 + B_{C2}^2)L_C$$

and it is possible to cause a variation in the focal distance.

On the other hand, when the magnitudes of $B_L$ on the locations of $B_{C1}$ and $B_{C2}$ are unequal, as illustrated in FIG. 3, the following holds subject to $B_L >> B_{C1}, B_{C2}$:

$$\Delta\left(\frac{1}{f}\right) \approx \frac{e}{8m\Phi_o}\int 2B_L(B_{C1} - B_{C2})\,dz$$

In the absence of the overlap of the magnetic fields, $$\Delta\left(\frac{1}{f}\right) = \frac{2e}{8m\Phi_o}\{\overline{B}_{L1} - \overline{B}_{L2}\}B_{Cmax} \cdot L_C$$

holds, and a variation in the focal distance can be in a manner similar to the example of FIG. 2. In the above expression, $\overline{B}_{L1}$ and $\overline{B}_{L2}$ indicate the mean values of $B_L$ in sections in which $B_{C1}$ and $B_{C2}$ exist, respectively. $B_{Cmax}$ and $L_C$ indicate the maximum value and half-width of the magnetic fields of the coils or subcoils at the time when $B_{C1}$ and $B_{C2}$ are equal, respectively.

In the embodiments, the two coils or subcoils 5 and 6 to be disposed in the lens can be constructed by making the numbers of turns of the coils or subcoils equal and by making the winding directions thereof opposite to each other. The lens includes a magnetic path, whereas the coils or subcoils must not include any magnetic path. Desirably, the electron lens equipment is constructed so that the magnetic fields formed by the coils or subcoils 5 and 6 may not be affected by an eddy current generated by the magnetic path. To this end, by way of example, the magnetic paths near the coils or subcoils 5 and 6 in the embodiments may be formed of a magnetic substance which is not electrically conductive, for example, ferrite.

Further, in accordance with this invention, the positions of the coils or subcoils to be disposed in the lens are not restricted to those specifically illustrated in the embodiments described, but they can be approximately set in dependence on setting conditions, etc. Moreover, in accordance with this invention, essentially the number of the coils or subcoils to be disposed in the lens is not restricted to two such coils or subcoils, as indicated in the illustrated embodiments, but it may well be three or more are provided. In addition, essentially this invention is applicable to both a focusing lens system and a minifying lens system.

As set forth above, this invention is constructed so as to cause a variation in only the focal distance and to prevent the rotation of an electron beam by an electron lens from occurring, and it is effective when applied to electron beam apparatuses, such as an apparatus for electron beam lithography, requiring a high-precision positioning (in which only the focal distance is varied and quite no influence is exerted on the others).

While we have shown and described several embodiments in accordance with the present invention, it is understood that the invention is not limited to the details shown and described herein but is intended to cover changes and modifications as obvious to one of ordinary skill in the art, and we therefore do not wish to be limited to the details shown and described herein but intend to cover all such changes and modifications known to those skilled in the art.

What is claimed is:

1. An electron lens system comprising:
   electron-optical lens means for generating a magnetic field through which an electron beam is to pass;
   at least two coils which are juxtaposed along an optical axis in the vicinity of said electron-optical lens means, at least one of said coils being disposed within a magnetic field of said electron-optical lens means; and
   means for adjusting the focal distance of said electron-optical lens means by exciting said coils in directions opposite to each other so that an electron beam passing through the magnetic field of said electron-optical lens means does not undergo any rotation ascribable to said electron-optical lens means.

2. An electron lens system as defined in claim 1, wherein two coils are provided, and said two coils have equal numbers of turns and are wound in directions opposite to each other.

3. An electron lens system as defined in claim 1, wherein said electron-optical lens means includes magnetic paths near said coils, which paths are formed of a magnetic substance which is electrically nonconductive.

4. An electron lens system as defined in claim 1, wherein said electron-optical lens means is provided in the form of a focusing lens system.

5. An electron lens system as defined in claim 1, wherein said electron-optical lens means includes magnetic paths near said coils, which paths are formed of ferrite.

6. An electron lens system as defined in claim 1, wherein two coils are arranged within a magnetic field of said electron-optical lens means.

7. An electron lens system comprising:
electron-optical lens means for generating a magnetic field through which an electron beam is to pass; and
means including at least two coils which are juxtaposed along an optical axis of said electron-optical lens means for adjusting the focal distance of said electron-optical lens means by generating additional magnetic fields in opposite directions to one another so that an electron beam passing through the magnetic field of said electron-optical lens means does not undergo any rotation ascribable to said electron-optical lens means;
At least one of said coils being disposed within the magnetic field of said electron-optical lens means.

8. An electron lens system as defined in claim 7, wherein two coils having equal numbers of turns and being wound in opposite directions provide said additional magnetic fields.

* * * * *